(12) United States Patent
Tamadate (10) Patent No.: US 7,160,796 B2
(45) Date of Patent: Jan. 9, 2007

(54) METHOD FOR MANUFACTURING WIRING BOARD AND SEMICONDUCTOR DEVICE

(75) Inventor: Yuka Tamadate, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 129 days.

(21) Appl. No.: 11/079,741

(22) Filed: Mar. 14, 2005

(65) Prior Publication Data

US 2005/0206009 A1      Sep. 22, 2005

(30) Foreign Application Priority Data

Mar. 17, 2004   (JP)   ............................ 2004-075561

(51) Int. Cl.
*H01L 21/44*   (2006.01)
*H01L 23/48*   (2006.01)

(52) U.S. Cl. ............... 438/612; 438/613; 438/617; 257/772; 257/779; 257/783; 257/223.02; 257/E23.023; 257/E21.508

(58) Field of Classification Search ........ 438/612–617; 257/772, 779, 780–786, E23.015, E23.02, 257/E23.023, E23.079, E21.508, E21.509, 257/E21.519; 228/180.22
See application file for complete search history.

(56) References Cited

U.S. PATENT DOCUMENTS 4,561,191 A  * 12/1985  Parkinson ............... 34/290
5,586,715 A  * 12/1996  Schwiebert et al. ..... 228/248.1
6,461,953 B1 * 10/2002  Sakuyama et al. ........ 438/612
6,548,898 B1 *  4/2003  Matsuki et al. ............ 257/746
6,781,221 B1    8/2004  Yoneda

FOREIGN PATENT DOCUMENTS

JP          7-7244        1/1995

* cited by examiner

*Primary Examiner*—Jasmine Clark
(74) *Attorney, Agent, or Firm*—Rankin, Hill, Porter & Clark LLP (57) ABSTRACT

Pads to be used for flip chip bonding and wire bonding are pattern-formed on a surface of a substrate. The pads to be used for flip chip bonding are shielded. Plating is applied to each of the pads to be used for wire bonding. Bonding pads for wire bonding is shielded by a masking tape. An adhesive layer is applied to the surface of each of pads to be used for flip chip bonding. Solder powder is provided to adhere to the surface of each of pads to be used for flip chip bonding with the adhesive layer. The masking tape is peeled off from the bonding pads for wire bonding. The solder powder is melted by reflowing so that the solder covers the pads to be used for flip chip bonding.

6 Claims, 6 Drawing Sheets

METHOD FOR MANUFACTURING WIRING BOARD AND SEMICONDUCTOR DEVICE

This application claims foreign priority based on Japanese patent application JP 2004-075561, filed on Mar. 17, 2004, the contents of which is incorporated herein by reference in its entirety.

BACKGROUND OF THE INVENTION

1. Field of the Invention

The present invention relates to a method for manufacturing semiconductor devices and, more particularly, to a method for manufacturing a wiring board having a bonding pad for flip chip bonding and a bonding pad for wire bonding, and to a semiconductor device using a wiring board obtained by the manufacturing method.

2. Description of the Related Art

Figure 6:
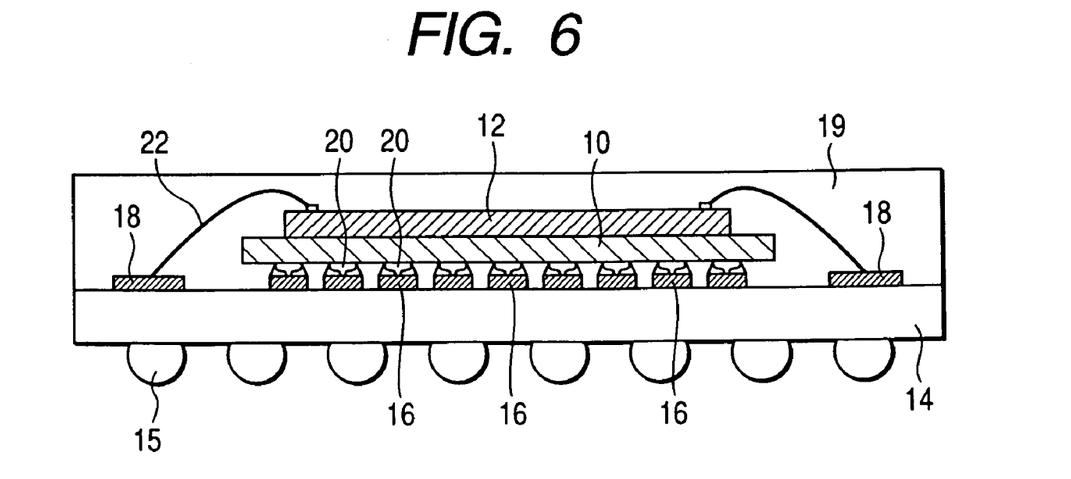
FIG. 6 is a cross-sectional view illustrating the configuration of a semiconductor device on which semiconductor elements are mounted by being stacked.

In the related art, there is a method of mounting a semiconductor element 10 by flip chip bonding, and a semiconductor element 12 by wire bonding, on a single substrate 14 (Refer to U.S. Pat. No. 6,781,221). FIG. 6 shows an example of a semiconductor device produced by employing a method of mounting two semiconductor elements 10 and 12 on the substrate 14 by stacking the elements and of sealing the semiconductor elements 10 and 12 with resin 19. To mount the semiconductor elements 10 and 12 by stacking thereon, in the semiconductor device, the lower semiconductor element 10 is mounted on the substrate 14 by flip chip bonding, while the upper semiconductor element 12 is mounted thereon by wire bonding. Reference numeral 20 designates a bonding bump formed on an electrode of the semiconductor element 10. Reference numeral 16 denotes a bonding pad for flip chip bonding. Reference numeral 18 represents a bonding pad for wire bonding. Reference numeral 22 denotes a bonding wire.

The method of mounting the semiconductor elements on the substrate 14 by utilizing flip chip bonding and wire bonding is effective in miniaturizing the semiconductor device. However, the semiconductor elements are mounted thereon by different connection configurations, that is, flip chip bonding and wire bonding. Thus, bonding pads 16 for flip chip bonding, and bonding pads 18 for wire bonding should be formed on the substrate 14.

Figure 7:
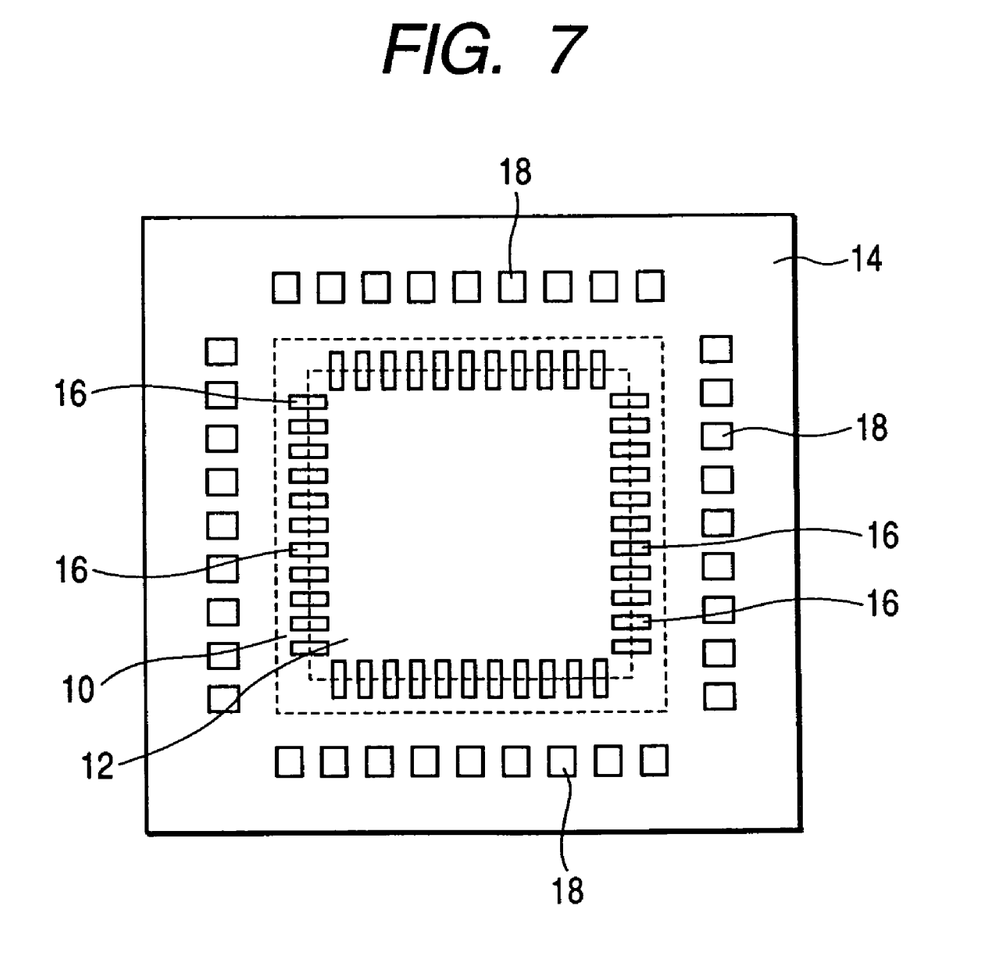
FIG. 7 is an explanatory view illustrating an example of a substrate on which bonding pads for flip chip bonding and bonding pads for wire bonding are formed.

FIG. 7 illustrates a state in which the bonding pad 16 for flip chip bonding and the bonding pad 18 for wire bonding are formed on the substrate 14. According to the mounting configuration of the semiconductor elements 10 and 12, the bonding pads 16 for flip chip bonding are placed along the inner side of the bonding pads 18 for wire bonding.

Meanwhile, bumps 20 (gold bumps) formed on the semiconductor element 10 are respectively bonded to the bonding pads 16 for flip chip bonding. Bonding wires (gold wires) are connected to the bonding pads 18, respectively. Thus, different surface treatments are performed on the pads 16 and 18.

That is, solder is applied to the surface of the bonding pad 16 in such a way as to cover the pad 16, while plating for bonding (for example, nickel plating and gold plating) is applied to the bonding pad 18. Thus, a related-art method is performed so that after a wiring pattern and the pads to be used as the bonding pads 16 and the bonding pads 18 are formed, first, plating is applied to the pads to be used as the bonding pads 18, and that subsequently, solder is applied to the pads to be used as the bonding pads 16, in such a way as to cover the pads 16.

When plating is applied to the pads to be used as the bonding pads 18, parts to be used as the bonding pads 16 are masked by a plating device, so that plating is applied only to the bonding pads 18. When solder is applied to the pads to be used as the bonding pads 16 in such a way as to cover the pads 16, the solder is applied to the bonding pads 16 by shielding the bonding pads 18 in such a way as to prevent the solder from applying to the bonding pads 18.

In a case where the bonding pads 16 for flip chip bonding are formed at extremely fine intervals, the following method is employed. That is, when solder is applied to the pads in such a way as to cover the pads, an adhesive layer is formed on each of the pads, and then solder powder is made to adhere to the pads with adhesive layer. Subsequently, the solder powder is melted to thereby apply the solder onto the surface of each of the pads in such a way as to cover the pads. In a case where solder is applied to the pads in such a manner as to cover each of the pads by performing this method, it is necessary to prevent the solder powder from adhering to unnecessary parts, such as the bonding pads 18. A practical mass production line requires a manufacturing method with good-workability, which is enabled to surely cover the surfaces of the bonding pads 18 and to surely cause solder to adhere only to the bonding pads 16.

SUMMARY OF THE INVENTION

The invention is accomplished so as to solve such problems. An object of the invention is to provide a method for manufacturing a wiring board having bonding pads for flip chip bonding and also having bonding pads for wire bonding, and a semiconductor device using this wiring board.

To achieve the foregoing object of the invention, each of a method and a device according to the invention has the following constitution. That is, the method according to the invention is a manufacturing method for a wiring board provided with bonding pads for flip chip bonding, to a surface of each of which solder is applied in such a way as to cover the surface, and bonding pads for wire bonding, to a surface of each of which plating is applied. In this method, a multi-device substrate is used as a workpiece, and pads to be used as the bonding pads for flip chip bonding an wire bonding are formed on a surface of the substrate, that then, the pads to be used as the bonding pads for flip chip bonding are shielded, and plating is applied to a surface of each of the pads to be used as the bonding pads for wire boding, that subsequently, a masking tape is applied to an area, in which the bonding pads for wire bonding are formed, to thereby shield the bonding pads, that thereafter, an adhesive layer is formed to the surface of each of the pads to be used as the bonding pads for flip chip bonding, and subsequently, solder powder is provided to adhere to the surface of each of the pads to be used as the bonding pads for flip chip bonding, and that then, the masking tape is peeled off therefrom and thereafter, the solder powder is melted by reflowing, thereby to apply the solder to the pads to be used as the bonding pads for flip chip bonding in such a way as to cover the pads to be used as the bonding pads for flip chip bonding.

Further, in the method of the invention, the workpiece may be a substrate formed like a strip, on which regions to be formed as individual semiconductor devices are formed in such a way as to be aligned lengthwise and breadthwise, and the masking tape may be a tape provided with openings which are formed in such a way as to be disposed in a grid-like arrangement by being respectively positioned at the regions to be formed as individual semiconductor devices. The bonding pads for wire bonding can surely be shielded by using the masking tape provided with openings which are formed by being respectively positioned at the regions to be formed as individual semiconductor devices. Thus, the method of the invention can preferably be utilized for mass-production of the semiconductor devices.

Furthermore, in the method of the invention, in each of the regions to be formed as individual semiconductor devices, the bonding pads for wire bonding may be disposed along an outer peripheral side of each of the regions to be formed as individual semiconductor devices, while the bonding pads for flip chip bonding may be disposed along an inner side of an area in which the bonding pads for wire bonding are disposed, and the masking tape may be a tape adapted to shield the area, in which the bonding pads for wire bonding are disposed, in each of the regions and provided with openings, from which the pads to be used as the bonding pads for flip chip bonding are exposed.

Additionally, in the method of the invention, after the solder powder may be made to adhere to the pads to be used as the bonding pads for flip chip bonding, the workpiece may be accommodated in a heating furnace to thereby temporarily attach the solder powder to the pads to be used as the bonding pads for flip chip bonding.

Further, in the method of the invention, nickel plating and gold plating may be applied to the pads to be used as the bonding pads for wire bonding, in this order, solder powder comprising a Sn—Ag material may be made to adhere to the pads to be used as the bonding pads, and Sn—Ag solder may be applied to a surface of each of the pads to be used as the bonding pads for flip chip bonding.

Furthermore, the device of the invention is a semiconductor device in which two semiconductor elements are mounted by being stacked on a wiring board manufactured by the aforementioned manufacturing method for a wiring board according to the invention. In this device, a first level one of the semiconductor elements opposed to the wiring board is connected to the wire bonding by flip chip bonding, and a second level one of the semiconductor elements opposed to the first level element is connected to the wiring board by wire bonding.

The manufacturing method for a wiring board according to the invention enables facilitation of the manufacture of the wiring boards having the bonding pads for wire bonding and also having the bonding pads for flip chip bonding by employing a method of shielding the bonding pads for wire bonding with the masking tape to thereby apply solder to the pads for flip chip bonding in such a way as to cover the pads therefor after plating is applied to the surfaces of the pads to be used as the bonding pads for wire bonding.

DETAILED DESCRIPTION OF THE INVENTION

Hereinafter, an embodiment of the invention is described in detail with reference to the accompanying drawings.

Figure 1A:
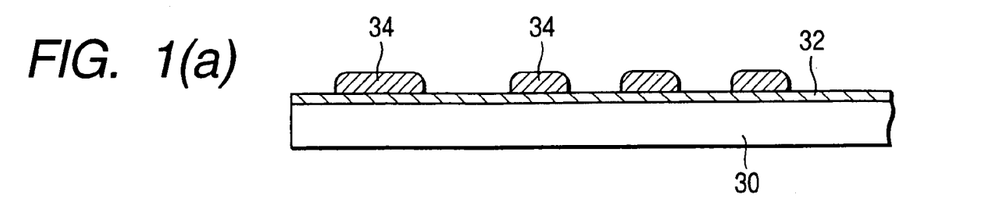
FIGS. 1(a) to 1(e) are explanatory views illustrating a method for manufacturing a wiring board according to the invention.

FIGS. 1(a) to 1(e) and 2(a) to 2(e) are explanatory views illustrating a process of manufacturing a wiring board according to the invention. FIG. 1(a) illustrates a state wherein a resist pattern 34 is formed on a surface of a copper foil 32 by applying a resist film on a single sided copper clad substrate, which is obtained by applying a copper foil 32 onto one of sides of a resin substrate 30 in such a way as to cover the one side thereof, and then exposing and developing the resist film. The resist pattern 34 is formed in such a manner as to coat a predetermined wiring pattern, and pattern portions of the bonding pads 16 for flip chip bonding, and the bonding pads 18 for wire bonding.

Figure 1B:
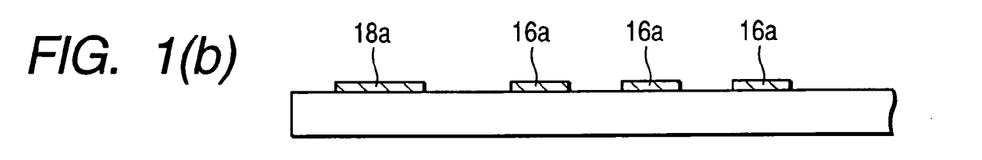

FIG. 1(b) illustrates a state in which the wiring pattern, the pads to be used as the bonding pads 16 and the pads to be used as the bonding pads 18 are simultaneously formed by using the resist pattern 34 as a mask and etching a copper foil 32. Reference character 16a designates the pads to be used as the bonding pads 16 for flip chip bonding. Reference character 18a designates the pads to be used as the bonding pads 18 for wire bonding.

Figure 1C:
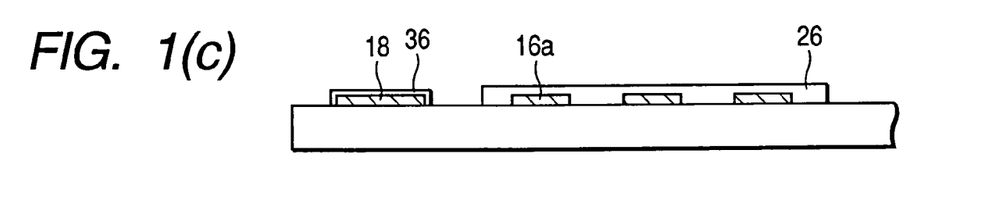

FIG. 1(c) illustrates a state in which the bonding pads 18 are formed by applying plating to surfaces of the pads 18a. In this embodiment, nickel plating and gold plating are applied thereto as the plating 36 in this order. The structure of the plating is not limited to the structure employed in this embodiment. For example, Ni (nickel) plating and Pd (palladium) plating may be applied in this order, or Ni plating, Pd plating and Au (gold) plating may be applied in this order. Incidentally, when plating is applied to the pads 18a, the pads 16a for flip chip bonding are shielded with a mask 26 in such a way as to prevent a plating solution from adhering thereto. For example, a plating resist can be used as this mask.

Figure 1D:
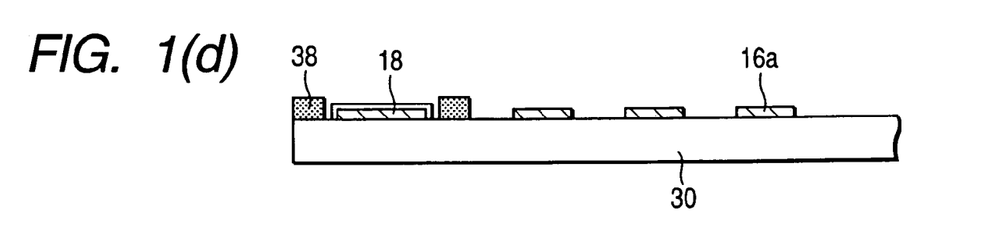

FIG. 1(d) illustrates a state in which only the pads 16a for flip chip bonding and the pads 18a for wire bonding are exposed from the surface of the resin substrate 30 by coating the surface of the resin substrate 30 with a solder resist 38 serving as a protective coat. Incidentally, the surface of the resin substrate 30 may be coated with the solder resist 38 before the plating is applied to the surfaces of the pads 18a.

Figure 3A:
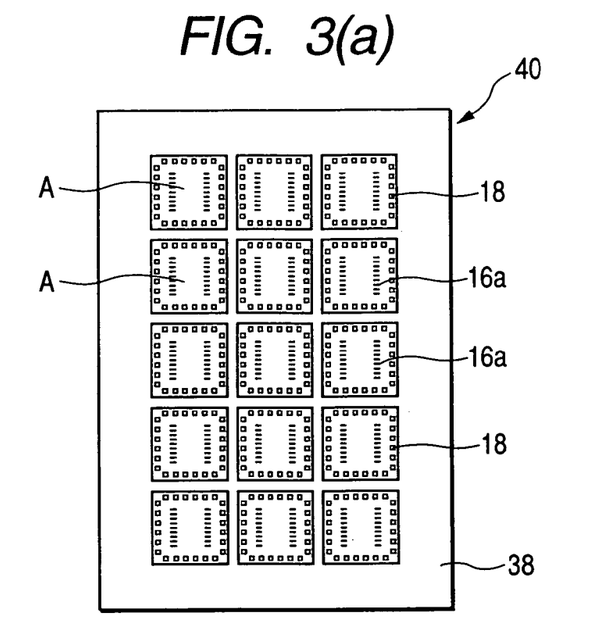
FIG. 3(a) is a plan view illustrating a wiring board (a workpiece) formed like a strip.
Figure 3B:
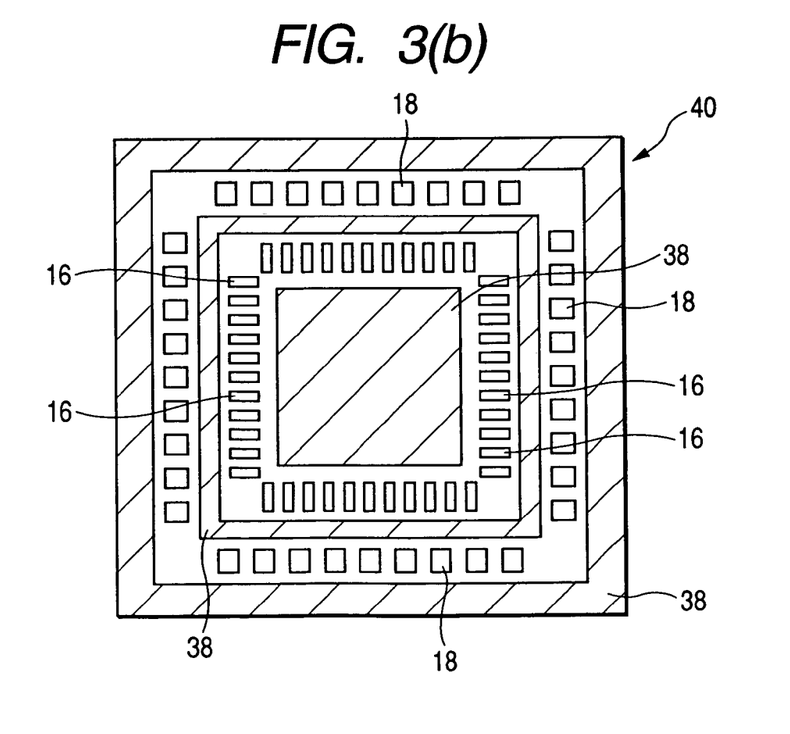
FIG. 3(b) is a plan view illustrating a part A of workpiece 40 in FIG. 3(a).

FIGS. 3(a) to 3(b) illustrate a workpiece 40 in which the solder resist 38 is applied to the surface of the resin substrate 30 in such a way as to cover the surface thereof except for the pads 16a and 18a. The workpiece 40 used in the manufacturing method for a wiring board according to this embodiment is obtained by forming the resin substrate 30 like a strip, as illustrated in FIG. 3(a). The workpiece 40 is provided so that plural semiconductor devices are obtained from a single resin substrate. As shown in FIG. 3(a), a part A is a partition part to be formed as a single semiconductor device. Regions to be respectively formed as individual semiconductor devices are provided on the workpiece 40 in such a way as to be aligned lengthwise and breadthwise. FIG. 3(b) illustrates an enlarged view of the part A of workpiece 40 in FIG. 3(a). In each of the partition regions, the bonding pads 18 are disposed along the outer peripheral side thereof, while the bonding pads 16 for flip chip bonding are disposed along the inner side of each of the bonding pads 18. In FIG. 3(*b*), areas marked with diagonal lines indicate areas applied with the solder resist 38. This is an example of the configuration of a semiconductor device of the type, in which semiconductor elements are mounted by being stacked, as illustrated in FIG. 7.

FIG. 1(*e*) illustrates a state wherein areas, in each of which the bonding pad 18 is formed, on the resin substrate 30, are masked with a tape 42 after the surface of the resin substrate 30 is coated with the solder resist 38. The tape 42 is used for preventing solder powder and the like from adhering to the surfaces of the bonding pads 18 when solder is applied to the surfaces of the pads 16*a* in such a manner as to cover the pads 16*a*. As illustrated in FIG. 1(*e*), the surface of the solder resist 38 is placed slightly higher than those of the bonding pads 18. Thus, when the tape 42 is provided on the bonding pads 18, the tape 42 adheres to the solder resists 38, which are slightly separated from the surface of the bonding pad 18 and opposed to each other, in such a way as to be put across the solder resists 38.

Figure 1E:
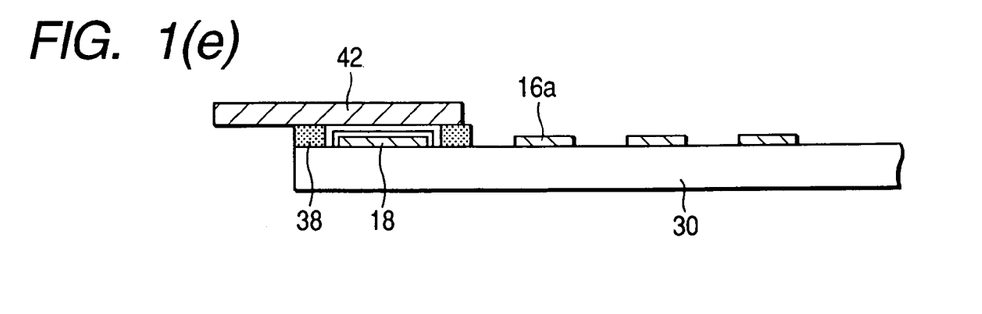

The tape 42 used in this embodiment is constituted so that the base thereof is made of a chloroethene based resin, and that the adhesive layer thereof is made of an acrylic resin. Although the adhesive layer is formed of a material that would cause no trouble for wire bonding even when adhesives are left on the bonding pads 18. In this embodiment, the tape 42 is made to adhere to the solder resists 38 so that the tape 42 is separated from the bonding pads 18, and thus the adhesives can be made to be hard to adhere to the surfaces of the bonding pads 18.

Figure 4:
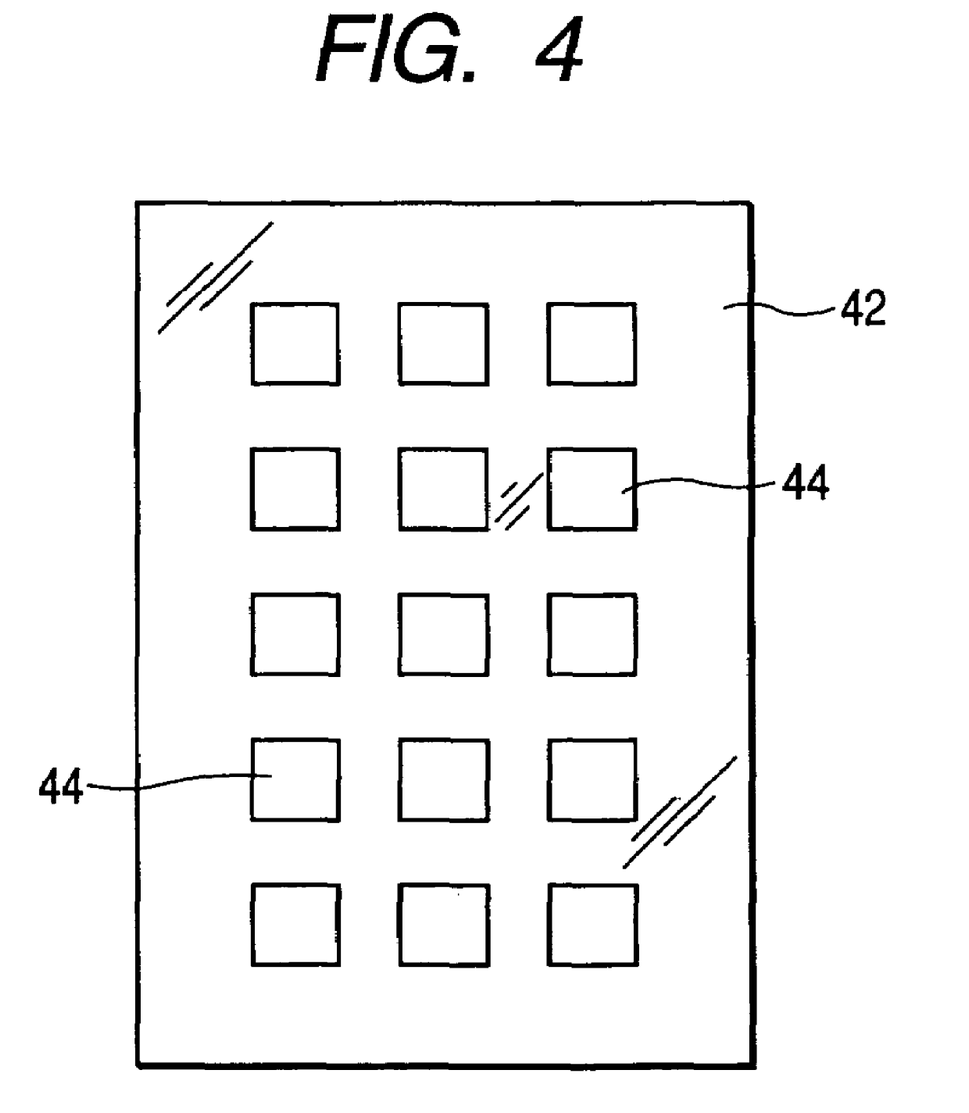
FIG. 4 is a plan view illustrating a masking tape adhering to a wiring board (a workpiece) formed like a strip.

FIG. 4 illustrates the masking tape 42 used for the actual workpiece 40. As described above, the workpiece 40 is formed like a strip. In the workpiece 40, the regions to be formed as semiconductor devices are formed as aligned partition parts. Thus, a grid-like tape provided with openings 44, which are respectively formed in the partition parts, is used as the masking tape 42.

Figure 5:
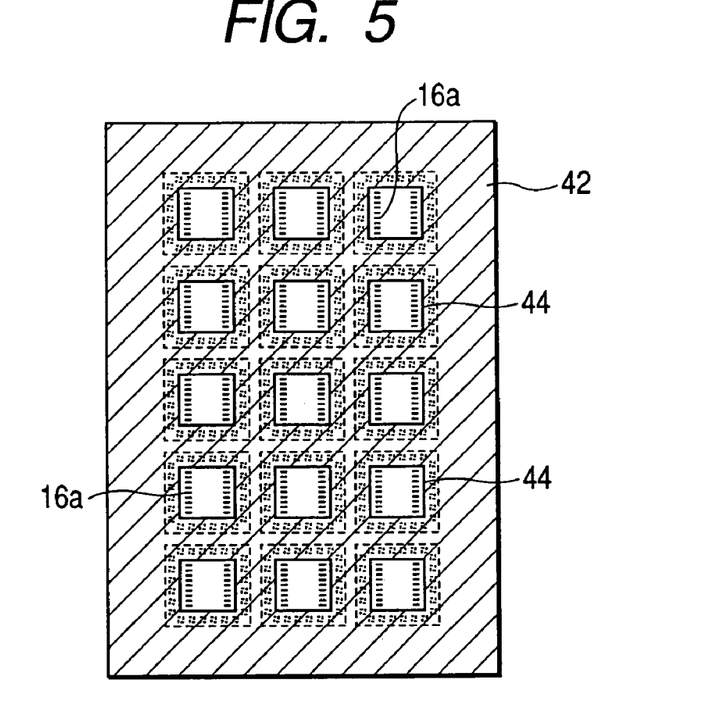
FIG. 5 is a plan view illustrating a state in which a masking tape adheres to a wiring board (a workpiece) formed like a strip.

FIG. 5 illustrates a state in which the masking tape 42 provided with the openings 44 adheres to the resin substrate 30. The openings 44 are formed as rectangular holes, each of which is a size smaller than a place at which the associated bonding pad 18 is disposed. The tape 42 is made by being aligned to the resin substrate 30 to adhere thereto. Thus, at partitions of the workpiece 40, the bonding pads 18 are shielded, while the pads 16*a* for flip chip bonding are exposed.

Incidentally, the masking tape 42 is actually used by being peeled off a separator, which is constituted by a resin film, in such a way as to adhere to the workpiece 40. The bonding pads 18 are sealed from the outside by making the tape 42 adhere to the surface of the solder resist 38.

FIGS. 2(*a*) to 2(*e*) are explanatory views illustrating a process of applying solder to the pads 16*a* to be used as the bonding pads 16*a* for flip chip bonding in such a way as to cover the pads 16*a*. FIG. 2(*a*) illustrates a state in which the adhesive layer 50 is formed on the surface of the pads 16*a* so as to make solder powder adhere thereto. The adhesive layer 50 is caused by immersing the workpiece 40 in an adhesive solution tank to adhere to the surfaces of the pads 16*a*. Although the adhesive solution selectively adheres to the surfaces of the pads 16*a* made of copper, the adhesive solution does not adhere to the bonding pads 18 even when the workpiece 40 is immersed in the adhesive solution tank, because the bonding pads 18 are coated with the tape 42.

Figure 2A:
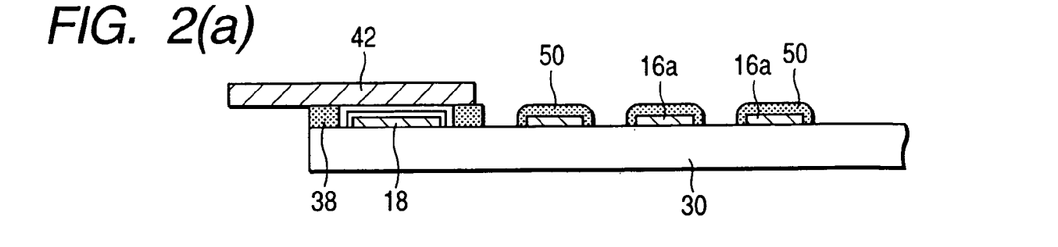
FIGS. 2(a) to 2(e) are explanatory views illustrating a method for manufacturing a wiring board according to the invention.
Figure 2B:
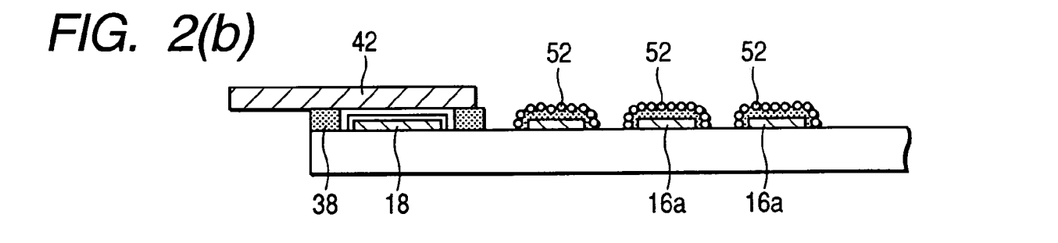
Figure 2C:
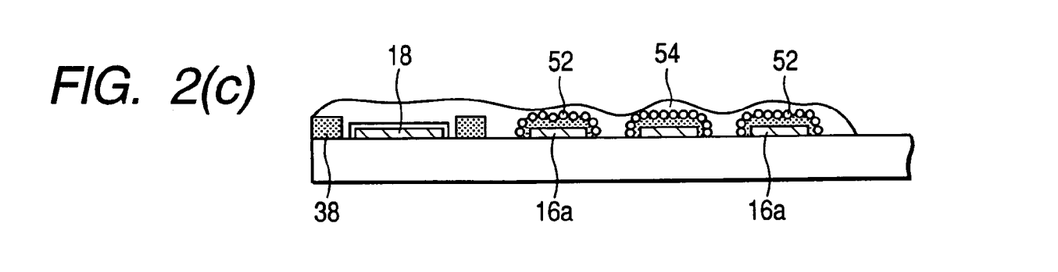
Figure 2D:
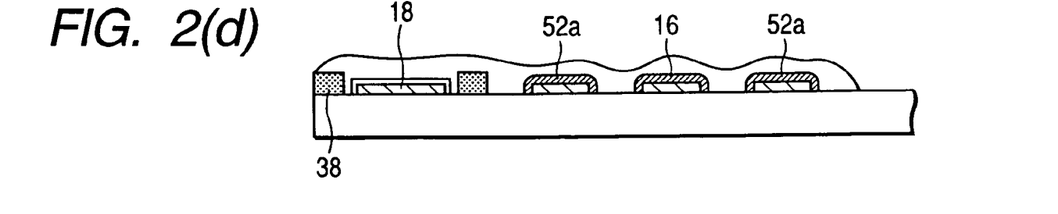
Figure 2E:
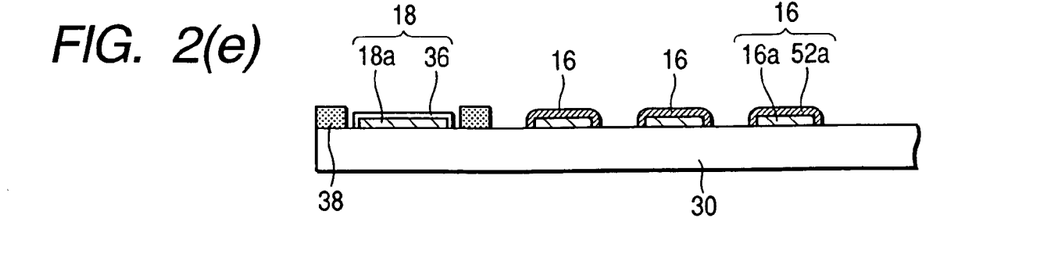

Subsequently, solder powder 52 is made to adhere to the surfaces of the pads 16*a* by being shaken off from above the workpiece 40 (see FIG. 2(*b*)). The solder powder having dropped onto the surface of the substrate, which is other than the pads 16*a*, is removed in a cleaning process. However, even in this cleaning process, no trouble for wire bonding occurs, because the bonding pads 18 are coated with the tape 42. Incidentally, the solder powder 52 used in this embodiment is solder powder comprising a Sn—Ag material.

The solder powder 52 adhering to the surfaces of the pads 16*a* is melted in a reflowing process. Thus, the solder powder 52 is applied to the surfaces of the pads 16*a* in such a way as to cover the pads 16*a*. In this embodiment, as a preliminary process of the reflowing process, the solder powder 52 is temporarily attached to the pads 16*a*. This temporary attachment is an operation of slightly melting the solder powder 52 and making the solder powder 52 adhere to the pads 16*a*. Actually, the solder powder 52 can tentatively be attached thereto by heating the substrate at about 170° C. for about one hour in the heating furnace. The masking tape 42 is peeled off before the process of temporarily attaching the solder powder is performed. This is because the tape 42 used in the embodiment does not have sufficient heat resistance. After the process of temporarily attaching the solder powder, foreign substances do not adhere to the surfaces of the bonding pads 18 even when the bonding pads 18 are not coated with the masking tape 42.

FIG. 2(*c*) illustrates a state in which the surfaces of the pads 16*a* are coated with flux 54 as a preliminarily process of the reflowing process. The flux 54 is used for improving the flowability of the solder and the bondability between the solder and the pad 16*a*.

FIG. 2(*d*) illustrates a state in which the solder powder 52 is melted in the reflowing process and the molten solder 52*a* is applied to the surfaces of the pads 16*a* in such a way as to cover the surfaces thereof.

FIG. 2(*e*) illustrates a state in which the flux 54 is cleaned after the reflowing, and in which a wiring board is finally obtained. This wiring board is adapted so that regarding the bonding pads 16 for flip chip bonding, the solder 52*a* is applied to the surfaces of the pads 16*a*, and that regarding the bonding pads 18 for wire bonding, the predetermined plating 36 is applied to the surfaces of the pads 18*a*. Consequently, the wiring board is provided as a wiring board, on which the semiconductor elements can be mounted by using both the flip chip bonding and the wire bonding.

Incidentally, for example, a method disclosed in JP-A-7-7244 can be utilized as the method of utilizing the adhesive layer 50 to make the solder powder adhere to the surfaces of the pads 16*a* and of applying the solder 52*a* to the surfaces of the pads 16*a* by reflowing in such a way as to cover the surfaces thereof.

In the manufacturing method for a wiring board according to the invention, as mentioned above, when the bonding pads 16 for flip chip bonding and the bonding pads 18 for wire bonding are formed on a single substrate, the process of forming the bonding pads 16 for flip chip bonding is performed in a state wherein the masking tape 42 is provided on parts, on which the bonding pads 18 are formed, to thereby prevent the bonding pads 18 from being exposed to the outside. The bonding pads 18 are coated with the masking tape 42, so that the bonding pads 18 can surely be protected in such a manner as to prevent the solder from being applied thereto in such a way as to cover the bonding pads 18. Further, because this is achieved by performing an operation of providing the tape 42 thereon, operations of making the tape 42 to the resin substrate 30 and of peeling off the tape 42 from the resin substrate 30 can easily be performed.

Especially, when the tape 42 is utilized, an operation of high-precision positioning can easily be achieved by providing positioning marks and positioning holes in the tape 42 and the resin substrate 30. Thus, workability can be improved while predetermined accuracy is satisfied. Consequently, the method according to the invention can preferably be utilized for mass-production of semiconductor devices.

In the manufacturing method for a wiring board, a method of forming a resist layer by applying liquid resist to the bonding pads 18 thereby to coat the bonding pads 18 with the resist layer can also be used as the method of coating the bonding pads 18 so as to apply solder to the bonding pads 16 in such a way as to cover the pads 16. However, the method of forming the resist layer by applying the resist has problems that the formation of the resist layer on the pattern, from which the pads 16a are exposed, by exposing and developing complicates the process, and that productivity is poor. Further, this method has another problem that because the resist layer is removed after the solder powder is made to adhere thereto, the solder powder may also be removed when the resist layer is removed.

The aforementioned method using the tape is superior in that this method does not have these problems. Further, this method is effective as a method that can preferably be utilized as an actual mass-production method.

Incidentally, in a case where a semiconductor device is manufactured by using the wiring board according to the invention, first, the first-level (or lower) semiconductor element is connected with flip chip bonding to the bonding pad 16 in the workpiece 40, on which the bonding pads 16 for flip chip bonding and the bonding pads 18 for wire bonding are formed, and an underfilling process is performed. Subsequently, the second-level (or upper) semiconductor element is stacked over the first-level semiconductor element. Then, the second-level semiconductor element is connected with wire bonding to the bonding pad 18. As the method of connecting the first-level semiconductor element to the bonding pad 16 with flip chip bonding, a method of forming gold bumps by using a wire bonder, thereby to connect between the first-level semiconductor element and the boding pad 16, and a method of forming solder bumps on the electrode of the semiconductor element to thereby connect between the first-level semiconductor element and the boding pad 16 can be utilized. Further, a wire bonding method using a gold wire can be utilized for wire bonding between the second-level semiconductor element and the bonding pad 18.

Subsequently, the workpiece, on which the semiconductor elements are mounted, is set in a mold for resin-molding. The entirety of one side, on which the semiconductor elements are mounted, thereof is resin-sealed. After the resin sealing, the workpiece 40 is cut into individual partition parts together with resin. Thus, discrete semiconductor devices can be obtained. The semiconductor device obtained in this way is constituted, as illustrated in FIG. 6, so that the semiconductor elements 10 and 12 are mounted on the substrate 14 by being stacked, that the first-level semiconductor element 10 is connected with flip chip bonding to the substrate 14, and that the second-level semiconductor element 12 is connected with wire bonding to the substrate 14. Incidentally, external connection terminals 15 are electrically connected to the bonding pads 16 and the bonding pads 18 through through-holes formed in the substrate 14.

What is claimed is:

1. A method for manufacturing a wiring board having bonding pads for flip chip bonding and bonding pads for wire bonding, said method comprising:
   forming pads to be used as the bonding pads for flip chip bonding and pads to be used as the bonding pads for wire bonding on a surface of a substrate as a workpiece,
   shielding the pads to be used as the bonding pads for flip chip bonding, and applying plating to a surface of each of the pads to be used as the bonding pads for wire bonding;
   applying a masking tape to an area, in which the bonding pads for wire bonding are formed, to thereby shield the bonding pads for wire bonding;
   forming an adhesive layer to a surface of each of the pads to be used as the bonding pads for flip chip bonding, and then providing solder powder to the surface of each of the pads to be used as the bonding pads for flip chip bonding to adhere thereto with the adhesive layer; and
   peeling off the masking tape from the area in which the bonding pads for wire bonding are formed, and then melting the solder powder by reflowing, thereby to apply the solder to the pads to be used as the bonding pads for flip chip bonding in such a way as to cover the pads to be used as the bonding pads for flip chip bonding.

2. The manufacturing method for a wiring board according to claim 1, wherein:
   the workpiece is a substrate formed like a strip, on which regions to be formed as individual semiconductor devices are formed in such a way as to be aligned lengthwise and breadthwise; and
   the masking tape is a tape provided with openings which are formed in such a way as to be disposed in a grid-like arrangement by being respectively positioned at the regions to be formed as individual semiconductor devices.

3. The manufacturing method for a wiring board according to claim 2, wherein:
   in each of the regions to be formed as individual semiconductor devices, the bonding pads for wire bonding are disposed along an outer peripheral side of each of the regions to be formed as individual semiconductor devices, while the bonding pads for flip chip bonding are disposed along an inner side of an area in which the bonding pads for wire bonding are disposed; and
   the masking tape is a tape adapted to shield an area, in which the bonding pads for wire bonding are disposed, in each of the regions and provided with openings, from which the pads to be used as the bonding pads for flip chip bonding are exposed.

4. The manufacturing method for a wiring board according to claim 1, further comprising:
   after the solder powder is provided to adhere to the pads to be used as the bonding pads for flip chip bonding, accommodating the workpiece in a heating furnace to thereby temporarily attach the solder powder to the pads to be used as the bonding pads for flip chip bonding.

5. The manufacturing method for a wiring board according to claim 1, wherein:
   the application of plating includes applying nickel plating and gold plating to the pads to be used as the bonding pads for wire bonding, in the order recited; and
   the solder powder comprises a Sn—Ag material, and the solder powder is provided to adhere to the pads to be used as the bonding pads for flip chip bonding, thereby to apply the Sn—Ag solder to the pads to be used as the bonding pads for flip chip bonding in such a way as to cover the pads to be used as the bonding pads for flip chip bonding.

6. A semiconductor device in which two semiconductor elements are mounted by being stacked on a wiring board manufactured by the manufacturing method for a wiring board according to claim 1, said device comprising:

a first level one of the semiconductor elements, which is opposed to the wiring board and connected to the wiring board by flip chip bonding; and a second level one of the semiconductor elements, which is opposed to the first level element and connected to the wiring board by wire bonding.

* * * * *